United States Patent
Nakai et al.

(10) Patent No.: US 9,809,490 B2
(45) Date of Patent: Nov. 7, 2017

(54) METHOD FOR PRODUCING OXYNITRIDE FILM BY ATOMIC LAYER DEPOSITION PROCESS

(71) Applicant: Panasonic Intellectual Property Management Co., Ltd., Osaka (JP)

(72) Inventors: Miyuki Nakai, Osaka (JP); Satoshi Shibata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/188,060

(22) Filed: Jun. 21, 2016

(65) Prior Publication Data

US 2017/0005358 A1 Jan. 5, 2017

(30) Foreign Application Priority Data

| Jul. 2, 2015 | (JP) | 2015-133955 |
| Jul. 31, 2015 | (JP) | 2015-152470 |
| Feb. 5, 2016 | (JP) | 2016-021027 |

(51) Int. Cl.

| C23C 16/00 | (2006.01) |
| C03C 17/22 | (2006.01) |
| C23C 16/30 | (2006.01) |
| C23C 16/455 | (2006.01) |
| H01M 10/0525 | (2010.01) |
| H01M 10/0562 | (2010.01) |

(52) U.S. Cl.
CPC ............ *C03C 17/22* (2013.01); *C23C 16/308* (2013.01); *C23C 16/45527* (2013.01); *C03C 2217/28* (2013.01); *C03C 2218/152* (2013.01); *H01M 10/0525* (2013.01); *H01M 10/0562* (2013.01)

(58) Field of Classification Search
None
See application file for complete search history.

(56) References Cited

U.S. PATENT DOCUMENTS

| 5,597,660 A | 1/1997 | Bates et al. |
| 2007/0264427 A1 | 11/2007 | Shinriki et al. |
| 2008/0318423 A9 | 12/2008 | Skarp et al. |
| 2009/0017208 A1 | 1/2009 | Shenai-Khatkhate et al. |
| 2011/0099798 A1 | 5/2011 | Nilsen et al. |
| 2011/0195574 A1 | 8/2011 | Blasco et al. |

FOREIGN PATENT DOCUMENTS

| JP | 2005-534173 | 11/2005 |
| JP | 2006-165537 | 6/2006 |
| JP | 2007-173824 | 7/2007 |
| JP | 2009-079290 | 4/2009 |

(Continued)

*Primary Examiner* — Mandy Louie
(74) *Attorney, Agent, or Firm* — McDermott Will & Emery LLP

(57) ABSTRACT

A method for producing an oxynitride film includes: (A) supplying a first precursor containing a network former into a reactor in which a substrate is placed; (B) supplying at least one of an oxygen gas and an ozone gas into the reactor; (C) supplying a second precursor containing at least one of an alkali metal element and an alkaline-earth metal element into the reactor; (D) supplying at least one of a nitrogen gas and an ammonia gas into the reactor; and (E) supplying a purge gas into the reactor.

11 Claims, 13 Drawing Sheets

(56) References Cited

FOREIGN PATENT DOCUMENTS

| | | | | |
|---|---|---|---|---|
| JP | 2011-508826 | | 3/2011 | |
| JP | 2012-505177 | | 3/2012 | |
| JP | 2012-517717 | | 8/2012 | |
| JP | 2013-189662 | | 9/2013 | |
| JP | 2015-520911 | | 7/2015 | |
| KR | 20140075024 | * | 6/2014 | ............ Y02P 20/544 |
| WO | 2004/010466 | | 1/2004 | |
| WO | 2010/093761 | | 8/2010 | |
| WO | 2013/158888 | | 10/2013 | |

* cited by examiner

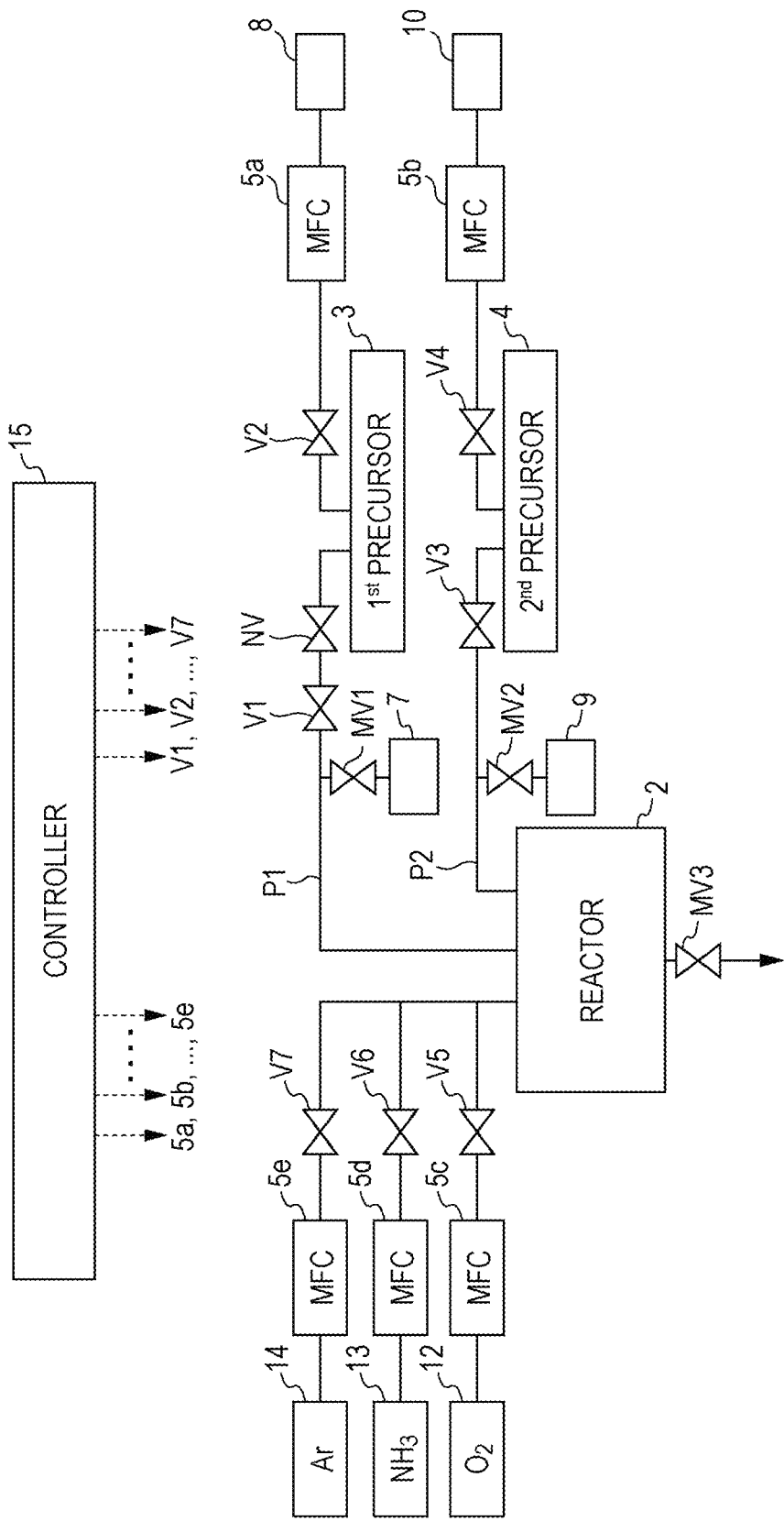

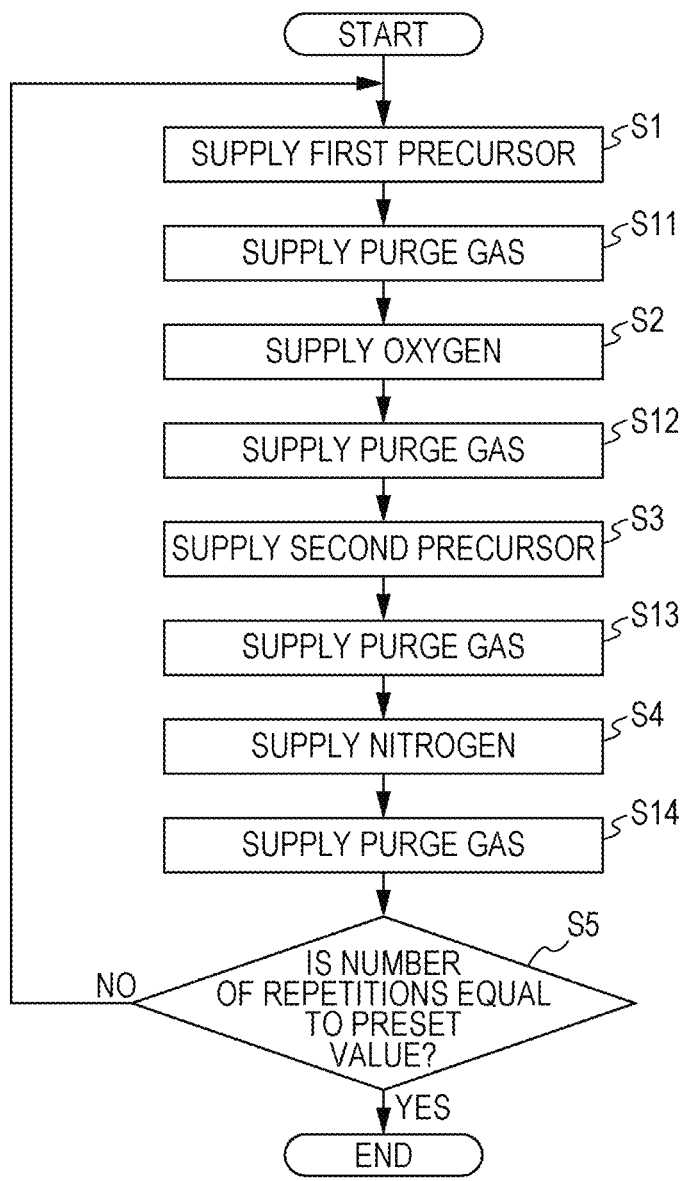

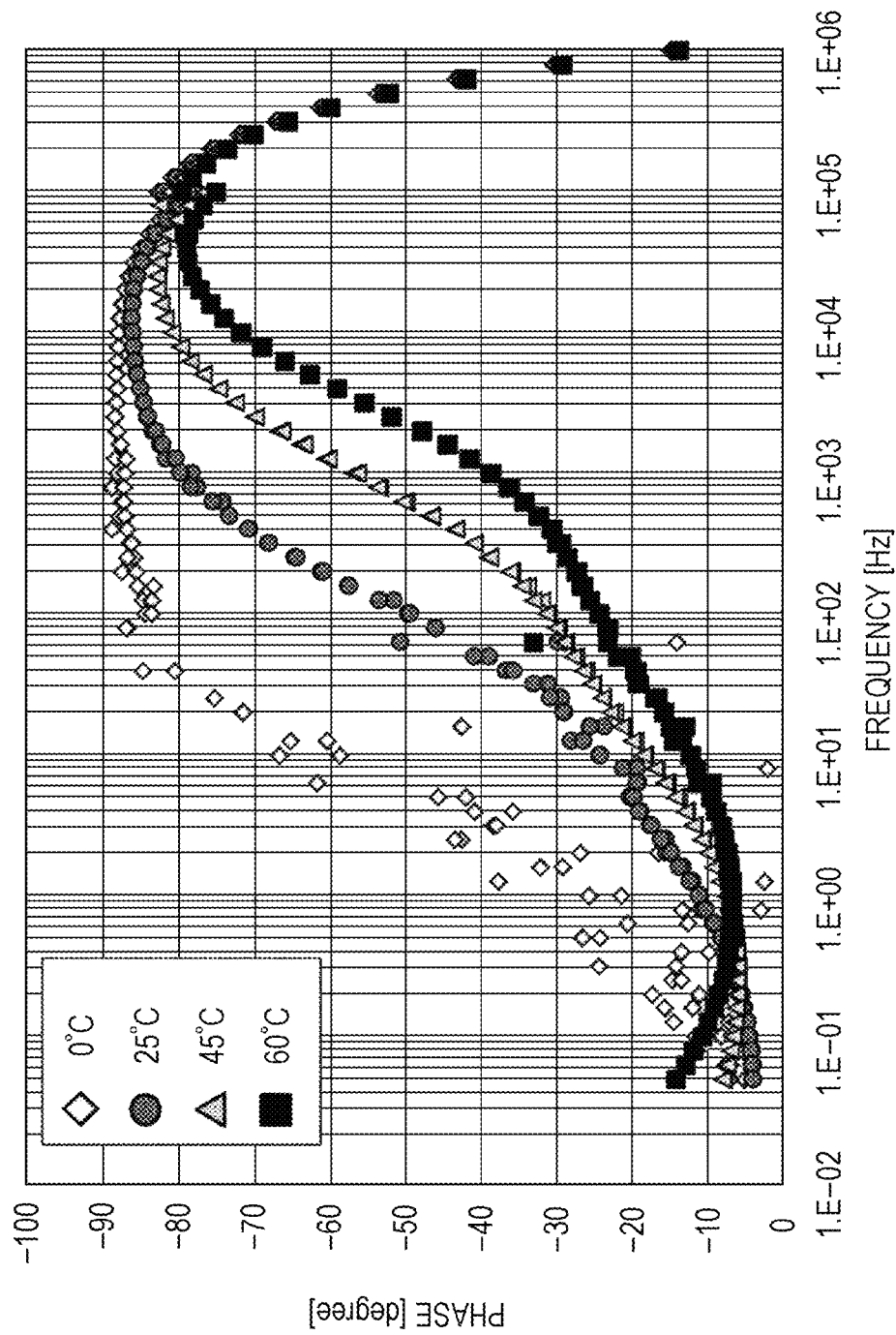

US 9,809,490 B2

METHOD FOR PRODUCING OXYNITRIDE FILM BY ATOMIC LAYER DEPOSITION PROCESS

BACKGROUND

1. Technical Field

The present disclosure relates to an oxynitride film and a method for producing the oxynitride film by an atomic layer deposition (ALD) process.

2. Description of the Related Art

In recent years, all-solid-state secondary batteries have been under development. The all-solid-state secondary batteries each include a solid electrolyte layer. U.S. Pat. No. 5,597,660 discloses an all-solid-state secondary battery including a solid electrolyte layer which is a lithium phosphorus oxynitride (LiPON) film. The LiPON film is formed by sputtering in a nitrogen atmosphere using an $Li_3PO_4$ target.

SUMMARY

A method for producing an oxynitride film according an aspect of the present disclosure includes: (A) supplying a first precursor containing a network former into a reactor in which a substrate is placed; (B) supplying at least one of an oxygen gas and an ozone gas into the reactor; (C) supplying a second precursor containing at least one of an alkali metal element and an alkaline-earth metal element into the reactor; (D) supplying at least one of a nitrogen gas and an ammonia gas into the reactor; and (E) supplying a purge gas into the reactor.

It should be noted that comprehensive or specific embodiments may be implemented as a system, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a schematic view of an example of the configuration of a production apparatus for an oxynitride film according to an embodiment;

FIG. 2B is a flowchart showing an example of a method for producing an oxynitride film according to an embodiment;

FIG. 3 is a graph showing an impedance spectrum of a LiPON film produced in Example 1;

DETAILED DESCRIPTION

Figure 2A:
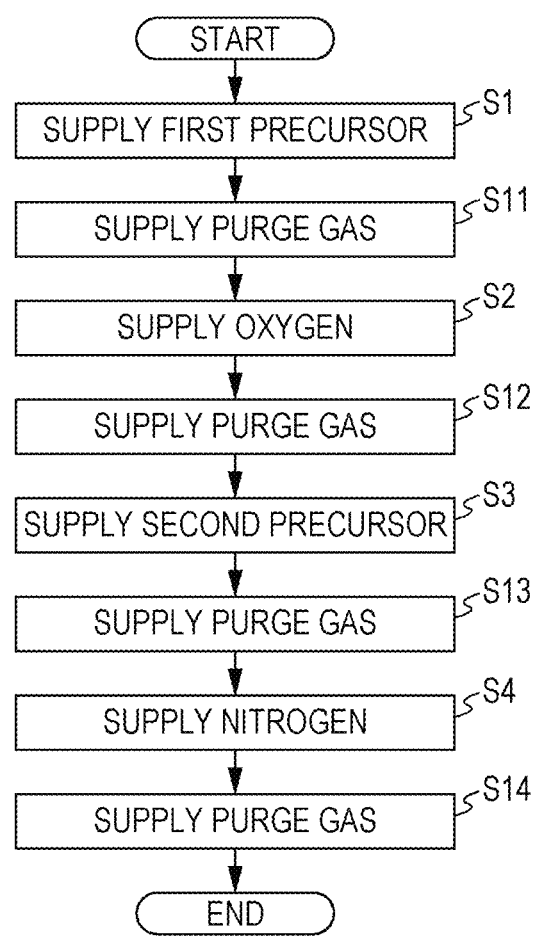
FIG. 2A is a flowchart showing an example of a method for producing an oxynitride film according to an embodiment.

Underlying Knowledge Forming Basis of the Present Disclosure

Knowledge obtained by the inventors is described below.

Conventional all-solid-state lithium ion secondary batteries are small in capacity and therefore have limited applications. An all-solid-state battery with a three-dimensional structure has been proposed for the purpose of achieving increased capacity (see *Advanced Functional Materials*, volume 18, issue 7, pages 1,057-1,066, Apr. 11, 2008). For example, a lithium phosphorus oxynitride (LiPON) film serving as a solid electrolyte is placed on the three-dimensional structure. However, in the case where the LiPON film is formed on the three-dimensional structure by a sputtering process, the formed LiPON film has a large variation in composition, thereby deteriorating characteristics as a solid electrolyte.

Solid electrolytes have higher ionic resistance as compared to typical electrolyte solutions. In addition, the resistance of the interface between a solid electrolyte and a positive electrode active material is high, and the resistance of the interface between the solid electrolyte and a negative electrode active material is also high. Therefore, as the thickness of a solid electrolyte layer is larger, the internal resistance of a battery is larger and the voltage drop is larger; hence, it is difficult to obtain sufficient charge/discharge characteristics at a large current. This results in a problem that, for example, the charge time is long.

Therefore, a conformal solid electrolyte thin-film is demanded.

A pulsed laser deposition (PLD) process and a sputtering process are known as a conventional process for forming a thin film containing Li. These conventional film-forming processes have problems below.

First, it is difficult for these conventional film-forming processes to form a defect- or pinhole-free film demanded in many industrial applications. For example, a LiPON film formed by the sputtering process has pinholes.

Second, it is difficult for these conventional film-forming processes to form a thin film uniformly covering the whole surface of a substrate. In the sputtering process, for example, LiPON is grown in a dotted pattern in an initial stage of film formation and then a film is formed after the thickness of a layer of LiPON exceeds 50 nm. Thus, it is difficult for the sputtering process to form a LiPON film with a small thickness (particularly a thickness of 50 nm or less). In order to form a film with on a large area in high yield by these conventional film-forming processes, the sufficient thickness of the film is probably about 2 μm.

Third, in these conventional film-forming processes, high energy is applied to a substrate during film formation and therefore the substrate may possibly be damaged.

In order to solve these problems, the inventors have investigated that a thin film containing Li is formed by an ALD process.

The ALD process is one allowing gas and a surface of a substrate to react with each other in a sequential and self-limiting manner. In the ALD process, pulses of two or more types of precursors are supplied into a reactor and a residual gas in the reactor are purged with an inert gas during intervals between the supplies of the pulses. This purge suppresses a vapor-phase reaction. Under ideal conditions, each precursor is saturated on all surfaces of the substrate while a pulse of the precursor is supplied. The growth of a film depends on the saturation density of the precursor. Thus, the film grows independently of the distribution of the precursor or the production rate of bonds. Therefore, in the ALD process, the growth of conformal films on all surfaces of the substrate is ensured. Damage that may be caused to the substrate by the PLD process or the sputtering process is avoided in the ALD process.

However, any thin film containing four or more elements including nitrogen and lithium has not been formed by the ALD process. For example, any LiPON thin-film has not been formed by a conventional ALD process.

The inventors have succeeded in forming a LiPON film, leading to the present disclosure. A production method, described below, according to an embodiment is applicable not only to a LiPON film but also to an arbitrary quaternary oxynitride film.

An oxynitride film according to an aspect of the present disclosure has high conformality. Therefore, the oxynitride film can be formed on, for example, a three-dimensional structure with any shape. The oxynitride film can be formed so as to follow, for example, the irregular structure of a base film.

An oxynitride film according to an aspect of the present disclosure is applicable to, for example, a solid electrolyte layer of an all-solid-state battery. This is capable of reducing the resistance of the interface between the solid electrolyte layer and a positive electrode active material and the resistance of the interface between the solid electrolyte layer and a negative electrode active material. Furthermore, this enables a solid electrolyte thin-film with a thickness of a few nanometers to be formed, thereby enabling a reduction in ionic resistance.

A method for producing an oxynitride film according to an aspect of the present disclosure can stably nitride a film without being affected by temperature variations in a reactor, temperature variations of a substrate, and the unevenness of the degree of vacuum in the reactor. For example, even in the case where a film is formed over a long period of time, the relative proportion of nitrogen in the film can be stabilized.

EMBODIMENTS

Methods for producing oxynitride films and oxynitride films produced by the methods according to various embodiments are exemplified below. Materials, compositions, thicknesses, shapes, material characteristics, steps of a production method, and the order of the steps are for exemplification only. A plurality of steps of a production method may be performed concurrently or in different periods.

1. PRODUCTION APPARATUS

FIG. 1 shows an example of the configuration of a production apparatus 1 for forming an oxynitride film according to an embodiment by an ALD process. The production apparatus 1 includes a reactor 2, a controller 15, a first precursor feeder 3, a second precursor feeder 4, an oxygen feeder 12, a nitrogen feeder 13, and a purge gas feeder 14.

The reactor 2 is, for example, a process chamber.

The first precursor feeder 3 supplies a first precursor into the reactor 2. The first precursor contains a network former. The first precursor feeder 3 is, for example, a bottle for holding the first precursor.

The second precursor feeder 4 supplies a second precursor into the reactor 2. The second precursor contains an alkali metal element and/or an alkaline-earth metal element. The second precursor feeder 4 is, for example, a bottle for holding the second precursor.

The production apparatus 1 further includes a first pipe P1 extending from the first precursor feeder 3 to the reactor 2 and a second pipe P2 extending from the second precursor feeder 4 to the reactor 2.

The oxygen feeder 12 supplies an oxygen gas and/or an ozone gas into the reactor 2. The nitrogen feeder 13 supplies a nitrogen gas and/or an ammonia gas into the reactor 2. The purge gas feeder 14 supplies a purge gas into the reactor 2 to purge residual gases remaining in the reactor 2.

The production apparatus 1 further includes auxiliary gas feeders 7 to 10, mass flow controllers 5a to 5e, valves V1 to V7, manual valves MV1 to MV3, and a needle valve NV as shown in FIG. 1.

The controller 15 controls, for example, the valves V1 to V7 and the mass flow controllers 5a to 5e. The controller 15 includes, for example, a memory and a processor. The controller 15 includes, for example, a semiconductor device, a semiconductor integrated circuit (IC), a large scale integration (LSI), or a combination thereof. The IC or the LSI may be integrated in a single chip or may be composed of a plurality of chips. The LSI and the IC may be called, for example, a system LSI, a very large scale integration (VLSI), or an ultra-large scale integration (UVLSI) depending on the degree of integration.

A commercially available production apparatus may be applied to the production apparatus 1 depending on the type of an oxynitride film to be produced. Examples of the commercially available production apparatus include: Savannah Systems, Fuji Systems, and Phoenix Systems (Ultratech/Cambridge NanoTech); ALD-series (Showa Shinku Co., Ltd.); TFS 200, TFS 500, TFS 120P 400A, and P800 (Beneq); OpAL and FlexAL (Oxford Instruments); InPassion ALD 4, InPassion ALD 6, and InPassion ALD 8 (SoLay Tec); AT-400 ALD System (Anric Technologies); and LabNano and LabNano-PE (Ensure NanoTech).

In the case where the commercially available production apparatus is applied, the apparatus may be customized, for example, such that a program for a production method according to this embodiment is stored in the memory in the controller and that the processor in the controller executes the program. With this customization, the commercially available production apparatus can operate as the production apparatus 1 according to this embodiment.

2. PRODUCTION METHOD

A method for producing the oxynitride film using the production apparatus 1 is described below as an example of a method for producing the oxynitride film according to this embodiment. In the present disclosure, the oxynitride film and the method for producing the oxynitride film are not limited to a specific production apparatus. In the present disclosure, each step of a production method may be performed on the basis of a predetermined program stored in a production apparatus or may be performed by manually operating a production apparatus.

2-1. Overview of Process

FIG. 2A is a flowchart showing an example of the method for producing the oxynitride film according to this embodiment. As shown in FIG. 2A, the method includes a step S1 of supplying the first precursor, which contains the network former, into the reactor 2; a step S2 of supplying an oxygen gas and/or an ozone gas into the reactor 2; a step S3 of supplying the second precursor, which contains the alkali metal element and/or the alkaline-earth metal element, into the reactor 2; a step S4 of supplying an ammonia gas and/or a nitrogen gas into the reactor 2; and steps S11 to S14 of supplying a purge gas into the reactor 2.

The order of the steps S1 to S4 and S11 to S14, the timing of the steps S1 to S4 and S11 to S14, and the number of times the steps S1 to S4 and S11 to S14 are performed are not particularly limited. For example, a series of the processes as shown in FIG. 2A may be repeatedly performed. For example, some of the steps S1 to S4 and S11 to S14 may be concurrently performed.

For example, the step S1 is performed at least once before the step S2 or S4. For example, the step S1 and the step S3 are performed in different periods.

In the case of the order shown in FIG. 2A, the first precursor is oxidized in the step S2. This allows a framework made of the network formers bonded to each other to be obtained. In the step S3, the alkali metal element and/or the alkaline-earth metal element is bonded to the framework. In the step S4, nitrogen is introduced, whereby the oxynitride film is obtained.

2-2. Preparation

Before the production of the oxynitride film is started, a substrate is placed in the reactor 2.

Examples of the material for the substrate include metal, a metal oxide, resin, glass, and ceramic. The metal may be, for example, Au. The metal oxide may be, for example, a metal composite oxide. Examples of the resin include polyester, polycarbonate, a fluorocarbon resin, and an acrylic resin. Examples of the glass include soda-lime glass and quartz glass. Examples of the ceramic include aluminium oxide, silicon, gallium nitride, sapphire, and silicon carbide. For example, a thermal oxide ($SiO_2$) with a thickness of 400 nm may be formed on a Si substrate.

The temperature in the reactor 2 is not particularly limited and may be 250° C. to 550° C., 300° C. to 500° C., or 320° C. to 480° C. Setting the temperature in the reactor 2 to 550° C. or lower allows film formation to proceed well. When the first precursor and/or the second precursor contains carbon, setting the temperature in the reactor 2 to 250° C. or higher enables the first precursor and/or the second precursor to be appropriately burned.

2-3. Supply of First Precursor

In the step S1, the first precursor, which contains the network former, is supplied into the reactor 2. For example, the valve V1 is opened, whereby the first precursor is supplied into reactor 2 from the first precursor feeder 3 as shown in FIG. 1.

The temperature of the first precursor feeder 3 is not particularly limited and may be 1° C. to 50° C. or 5° C. to 45° C. when the vapor pressure of the first precursor is high.

In the step S1, an auxiliary gas may be supplied to the reactor 2 from the auxiliary gas feeder 7 by opening the manual valve MV1. The auxiliary gas sweeps the first precursor, released into the first pipe P1 from the first precursor feeder 3, to the reactor 2. The flow rate of the auxiliary gas is not particularly limited and may be 20 ml/min to 60 ml/min or 25 ml/min to 50 ml/min.

In the step S1, the flow rate of the first precursor may be controlled by adjusting the opening of the needle valve NV. The opening of the needle valve NV is, for example, 10% to 60%.

In the step S1, the auxiliary gas may be supplied to the reactor 2 from the auxiliary gas feeder 8 by opening the valve V2 depending on the type of the first precursor. The auxiliary gas sweeps the first precursor into the reactor 2. The flow rate of the auxiliary gas may be controlled by the mass flow controller 5a.

The temperature of the auxiliary gas supplied from each of the auxiliary gas feeders 7 and 8 is not particularly limited and may be 100° C. to 300° C. or 120° C. to 280° C.

The auxiliary gas is, for example, an inert gas. Examples of the inert gas include an argon gas and a nitrogen gas. The auxiliary gas may be a single type of gas or a mixture of two or more types of gases.

The term "network former" refers to an atom or atom groups (i.e., functional groups) which are directly or indirectly bonded with each other to form a network structure or which have already formed the network structure. The network structure is the framework of the oxynitride film. The network former may be, for example, part of a molecule of the first precursor. In this case, another part of the molecule may be separated when the network structure is formed.

The network former is not particularly limited and may contain, for example, at least one selected from the group consisting of P, B, Si, and V. The network formers may contain, for example, P.

The first precursor is not particularly limited. Examples of the first precursor include a phosphorus-containing compound, a vanadium compound, and a silane compound. Examples of the phosphorus-containing compound include tris(dimethylamino)phosphine (TDMAP), trimethylphosphine (TMP), triethylphosphine (TEP), and tert-butylphosphine (TBP). Examples of the vanadium compound include tetrakis(diethylamido)vanadium ($V[N(C_2H_5)_2]_4$) and tetrakis(dimethylamido)vanadium ($V[N(CH_3)_2]_4$). Examples of the silane compound include tris(dimethylamino)silane (3DMAS) and bis(ethylmethylamino)silane (BEMAS). These compounds may be used alone or in combination.

The step S1 is finished by closing the valve V1. The duration of the step S1 corresponds to, for example, the time from opening the valve V1 to closing the valve V1. The duration of the step S1 is not particularly limited and may be about 0.01 seconds to 10 seconds, about 0.05 seconds to 8 seconds, or about 0.1 seconds to 5 seconds.

2-4. Supply of Oxygen

In the step S2, the oxygen gas and/or the ozone gas is supplied into the reactor 2. For example, the valve V5 is opened, whereby the oxygen gas and/or the ozone gas is supplied into the reactor 2 from the oxygen feeder 12 as shown in FIG. 1.

The oxygen gas may contain, for example, oxygen radicals produced by a plasma treatment. Plasma ALD enables reactivity to be increased and also enables the temperature of a system to be reduced.

The ozone gas may be produced in such a manner that, for example, oxygen is supplied to an OT-020 ozone generator (Ozone Technology) as described in U.S. Patent Application Publication No. 2011/0099798 A1.

The flow rate of the oxygen gas and/or the ozone gas is controlled by the mass flow controller 5c and may be, for example, 20 ml/min to 60 ml/min or 30 ml/min to 50 ml/min. The concentration of the oxygen gas and/or the ozone gas is not particularly limited and may be, for example, 100%. The temperature the oxygen gas and/or the ozone gas is not particularly limited and may be, for example, 100° C. to 300° C. or 120° C. to 280° C.

The step S2 is finished by closing the valve V5. The duration of the step S2 corresponds to the time from opening the valve V5 to closing the valve V5. The duration of the step S2 is not particularly limited and may be about 0.1 seconds to 15 seconds, about 0.2 seconds to 10 seconds, or about 0.2 seconds to 8 seconds.

2-5. Supply of Metal

In the step S3, the second precursor, which contains the alkali metal element and/or the alkaline-earth metal element, is supplied into the reactor 2. For example, the valve V3 is opened, whereby the second precursor is supplied into the reactor 2 from the second precursor feeder 4 as shown in FIG. 1.

The temperature of the second precursor feeder 4 is not particularly limited and may be 90° C. to 190° C. or 95° C. to 180° C. when the vapor pressure of the second precursor is low.

In the step S3, the auxiliary gas may be supplied to the reactor 2 from the auxiliary gas feeder 9 by opening the manual valve MV2. The auxiliary gas sweeps the second precursor, released into the second pipe P2 from the second precursor feeder 4, to the reactor 2. The flow rate of the auxiliary gas is not particularly limited and may be 20 ml/min to 60 ml/min or 30 ml/min to 55 ml/min.

In the step S3, the auxiliary gas may be supplied to the reactor 2 from the auxiliary gas feeder 10 by opening the valve V4 depending on the type of the second precursor. The auxiliary gas sweeps the second precursor to the reactor 2. The flow rate of the auxiliary gas may be controlled by the mass flow controller 5b. The flow rate of the auxiliary gas is not particularly limited and may be 1 ml/min to 30 ml/min or 5 ml/min to 20 ml/min.

The temperature of the auxiliary gas supplied from each of the auxiliary gas feeders 9 and 10 is not particularly limited and may be 100° C. to 300° C. or 120° C. to 280° C.

The auxiliary gas supplied from each of the auxiliary gas feeders 9 and 10 may be substantially the same as that exemplified in the description of the step S1.

The second precursor is a substance containing the alkali metal element and/or the alkaline-earth metal element. Examples of the alkali metal element include Li, Na, K, Rb, Cs, and Fr. The alkali metal element may be at least one selected from the group consisting of Li, Na, and K. The alkali metal element may be Li. Examples of the alkaline-earth metal element include Be, Mg, Ca, Sr, Ba, and Ra. The alkaline-earth metal element may be at least one of Mg and Ca. In the present disclosure, the term "alkaline-earth metal element" refers to an alkaline-earth metal element in a broad sense and thus includes Be and Mg. The above-mentioned metal elements may be used alone or in combination.

The second precursor may contain, for example, at least one selected from the group consisting of Li, Na, Mg, and Ca.

The second precursor is not particularly limited. Examples of the second precursor include lithium 2,2,6,6-tetramethylheptane-3,5-dionate (Li(thd)), lithium alkoxides such as lithium tert-butoxide (Li (t-OBu)), alkyl lithium such as n-butyl lithium (n-BuLi), cyclic lithium compounds such as lithium cyclopentadienyl (LiCp) and lithium dicyclohexylamide, bis(cyclopentadienyl) magnesium ($Cp_2Mg$), bis(methylcyclopentadienyl) magnesium ($MeCp_2Mg$), and bis(ethylcyclopentadienyl) magnesium ($EtCp_2Mg$). These compounds may be used alone or in combination.

The step S3 is finished by closing the valve V3. The duration of the step S3 corresponds to, for example, the time from opening the valve V3 to closing the valve V3. The duration of the step S3 is not particularly limited and may be about 0.01 seconds to 10 seconds, about 0.05 seconds to 8 seconds, or about 0.1 seconds to 5 seconds.

2-6. Supply of Nitrogen

In the step S4, the ammonia gas and/or the nitrogen gas is supplied into the reactor 2. For example, the valve V6 is opened, whereby the ammonia gas and/or the nitrogen gas is supplied into reactor 2 from the nitrogen feeder 13 as shown in FIG. 1.

The nitrogen gas may contain, for example, nitrogen radicals produced by a plasma treatment. Plasma ALD enables reactivity to be increased and also enables temperature of a system to be reduced.

The flow rate of the ammonia gas and/or the nitrogen gas is controlled by the mass flow controller 5d and may be, for example, 20 ml/min to 60 ml/min or 30 ml/min to 50 ml/min. The concentration of the ammonia gas and/or the nitrogen gas is not particularly limited and may be, for example, 100%. The temperature the ammonia gas and/or the nitrogen gas is not particularly limited and may be, for example, 100° C. to 300° C. or 120° C. to 280° C.

The step S4 is finished by closing the valve V6. The duration of the step S4 corresponds to the time from opening the valve V6 to closing the valve V6. The duration of the step S4 is not particularly limited and may be about 0.1 seconds to 15 seconds, about 0.2 seconds to 10 seconds, or about 0.2 seconds to 8 seconds.

2-7. Supply of Purge Gas

In the steps S11 to S14, the purge gas is supplied into the reactor 2, whereby residual gases remaining in the reactor 2 are purged. For example, the valve V7 is opened, whereby the purge gas is supplied into the reactor 2 from the purge gas feeder 14 as shown in FIG. 1.

The flow rate of the purge gas is controlled by the mass flow controller 5e and may be, for example, 20 ml/min to 60 ml/min or 30 ml/min to 50 ml/min. The temperature the purge gas is not particularly limited and may be, for example, 100° C. to 300° C. or 120° C. to 280° C.

For example, after each of the steps S1 to S4 is finished, a corresponding one of the steps S11 to S14 may be performed. Alternatively, each of the steps S11 to S14 may be performed concurrently with a corresponding one of the steps S1 to S4. For example, in order to sufficiently remove gases in the reactor 2, a purge step (e.g., one of the steps S11 to S14) may be continuously performed as a background process until the formation of the oxynitride film is finished after the formation of the oxynitride film is started.

The duration of each of the steps S11 to S14 is not particularly limited and may be about 0.1 seconds to 20 seconds, about 0.5 seconds to 15 seconds, or about 1.0 second to 10 seconds.

The purge gas is, for example, an inert gas. The inert gas is, for example, an argon gas and/or a nitrogen gas. The purge gas may be a single type of gas or a mixture of two or more types of gases.

The purge gas may be the same as or different from the auxiliary gas used in the step S1 and/or S3.

2-8. Supply of Ammonia Gas

The method according to this embodiment may further include a step of supplying an ammonia gas into the reactor 2 in addition to the step S4. The step of supplying the ammonia gas may be performed concurrently with at least one selected from the group consisting of the steps S1 to S3 and S11 to S14. This enables nitrogen to be stably introduced into the oxynitride film and also enables the percentage of nitrogen in the oxynitride film to be increased.

Alternatively, the step S4 may be a step of supplying an ammonia gas into the reactor 2 and may be performed concurrently with at least one selected from the group consisting of the steps S1 to S3 and S11 to S14.

In this case, for example, the valve V6 is opened, whereby the ammonia gas is supplied into reactor 2 as shown in FIG. 1. For example, the valve V6 may be consistently open until the formation of the oxynitride film is finished after the formation of the oxynitride film is started. The flow rate of the ammonia gas is not particularly limited and may be, for example, 30 ml/min to 100 ml/min or 50 ml/min to 100 ml/min. The concentration of the ammonia gas is not particularly limited and may be, for example, 100%. The temperature of the ammonia gas is not particularly limited and may be 100° C. to 200° C. The temperature of the ammonia gas may be 180° C. to 200° C. for the purpose of reducing the decrease in temperature of the reactor 2. The supply time of the ammonia gas is not particularly limited.

2-9. Degree of Vacuum in Reactor and Temperature of Pipes

In the method according to this embodiment, the degree of vacuum in the reactor 2 may be controlled. The degree of vacuum in the reactor 2 may be controlled by adjusting, for example, the opening of the manual valve MV3 for evacuation as shown in FIG. 1.

The degree of vacuum is set depending on the type of the oxynitride film and may be, for example, 0.1 Torr to 8.0 Torr or 0.5 Torr to 5.0 Torr. Setting the degree of vacuum to 0.1 Torr or more allows, for example, the first precursor to be continuously supplied into the reactor 2, whereby the first precursor is sufficiently oxidized. Therefore, for example, when the first precursor contains carbon, the amount of carbon in the oxynitride film can be reduced by sufficient oxidation. Setting the degree of vacuum to 8.0 Torr or less allows, for example, the supply of the second precursor to be appropriately controlled.

The degree of vacuum in the reactor 2 can be measured with, for example, a Pirani gauge, TPR280 DN16 ISO-KF (Pfeiffer Vacuum).

In the method according to this embodiment, the temperature of each pipe may be set, for example, as described below.

Referring to FIG. 1, for example, the temperature of the first pipe P1 and the temperature of the second pipe P2 are set higher than the boiling point or sublimation temperature of the first precursor and higher than the boiling point or sublimation temperature of the second precursor. When the first precursor is, for example, tris(dimethylamino)phosphine, the boiling point of the first precursor is about 48° C. to 50° C. When the second precursor is, for example, lithium tert-butoxide, the boiling point of the second precursor is about 68° C. to 70° C.

For example, the temperature of the first pipe P1 and the temperature of the second pipe P2 are higher than the temperature of the first precursor feeder 3 and are higher than the temperature of the second precursor feeder 4. This enables the solidification of the first precursor in the first pipe P1 to be prevented and also enables the solidification of the second precursor in the second pipe P2 to be prevented.

The temperature of the first pipe P1 and the temperature of the second pipe P2 may be 55° C. or more higher than the temperature of the first precursor feeder 3 and may be 55° C. or more higher than the temperature of the second precursor feeder 4. The temperature of the first pipe P1 and the temperature of the second pipe P2 may be 60° C. or more higher than the temperature of the first precursor feeder 3 and may be 60° C. or more higher than the temperature of the second precursor feeder 4.

For example, when the temperature of the first precursor feeder 3 is 35° C. and the temperature of the second precursor feeder 4 is 100° C., the temperature of the first pipe P1 and the temperature of the second pipe P2 may be set to about 180° C.

2-10. Repetitive Treatment

FIG. 2B is a flowchart showing an example of a method for producing an oxynitride film according to an embodiment. The method shown in FIG. 2B includes a step S1 of supplying the first precursor into the reactor 2, a step S2 of supplying the oxygen gas and/or the ozone gas into the reactor 2, a step S3 of supplying the second precursor into the reactor 2, a step S4 of supplying the ammonia gas and/or the nitrogen gas into the reactor 2, steps S11 to S14 of supplying the purge gas into the reactor 2, and a step S5 of judging whether the number of repetitions has reached a preset value. This allows a cycle including the steps S1 to S5 and S11 to S14 to be repeated a plurality of times. For FIG. 2B, matters described with reference to FIG. 2A will not be described in detail.

In the method shown in FIG. 2B, after each of the steps S1 to S4 is completed, a corresponding one of the steps S11 to S14 is performed.

In the example shown in FIG. 2B, whether the number of repetitions has reached the preset value is judged in the step S5. In the case where the number of repetitions has not reached the preset value (NO in the step S5), the cycle returns to the step S1. In the case where the number of repetitions has reached the preset value (YES in the step S5), the formation of the oxynitride film is finished.

The number of repetitions of the cycle is not particularly limited and is appropriately set depending on, for example, the target thickness of the oxynitride film, the type of the first precursor, and the type of the second precursor. The number of repetitions of the cycle may be, for example, about 2 to 8,000 or about 5 to 3,000. In the case where the thickness of the oxynitride film is adjusted to, for example, about 500 nm, the number of repetitions of the cycle may be set to 7,000 to 8,000. Alternatively, in the case where the thickness of the oxynitride film is adjusted to 50 nm or less, the number of repetitions of the cycle may be set to 300 or less.

In the present disclosure, the term "repetition" is not limited to the case where each step is completed in one cycle. For example, in the case where the ammonia gas is continuously supplied into the reactor 2 until the formation of the oxynitride film is finished after the formation of the oxynitride film is started, the step is not completed in one cycle but is continuously performed over a plurality of cycles. In the present disclosure, the term "repetition" may include this case.

In this embodiment, the thickness of the oxynitride film is not particularly limited. The thickness of the oxynitride film may be, for example, 550 nm or less or 300 nm or less. The thickness of the oxynitride film may be, for example, 200 nm or less, 150 nm or less, 110 nm or less, 100 nm or less, or 50 nm or less. The lower limit of the thickness of the oxynitride film is not particularly limited and may be 0.1 nm or more or 1 nm or more.

In the example shown in FIG. 2B, each of the steps S1 to S4 is performed once in one cycle. The number of times each of the steps S1 to S4 is performed is not limited to one. The number of times each of the steps S11 to S14 is performed and the timing of each of the steps S11 to S14 are not limited to the example shown in FIG. 2B.

Whether the formation of the oxynitride film is continued or is finished may be judged on the basis of a condition different from the number of repetitions. The formation of the oxynitride film may be finished on the basis that, for example, the elapsed time reaches a predetermined value or on the basis that, for example, the thickness of the oxynitride film reaches a predetermined value.

The relative proportion of each element in the oxynitride film may be controlled depending on, for example, the flow rate of the first precursor, the duration of a pulse of the first precursor, the flow rate of the second precursor, the duration of a pulse of the second precursor, and the duration of a pulse of the purge gas. The relative proportion of each element in the oxynitride film may be controlled in such a manner that, for example, (i) the flow rate of the second precursor, which has the lowest vapor pressure, is set and (ii) the flow rate of another element gas and the duration of a pulse of the element gas are set using the set flow rate of the second precursor as a base.

2-11. Method for Producing LiPON Film

An example of a method for producing an oxynitride film which is a lithium phosphorus oxynitride (LiPON) film is described below. Matters described with reference to FIG. 2A or 2B will not be described in detail.

A method for producing the LiPON film includes, for example, a step S1 of supplying a first precursor containing phosphorus into the reactor 2, a step S2 of supplying an oxygen gas and/or an ozone gas into the reactor 2, a step S3 of supplying a second precursor containing lithium into the reactor 2, and a step S4 of supplying an ammonia and/or a nitrogen gas into the reactor 2. These steps are performed in the order shown in FIG. 2A.

Phosphorus in the first precursor binds to oxygen on a surface of a substrate. Oxygen contained in the oxygen gas and/or the ozone gas oxidizes phosphorus on the substrate surface to form a phosphate framework. Lithium in the second precursor binds to oxygen in the phosphate framework with coordinate bonding or ionic bonding, for example. Nitrogen contained in the oxygen gas and/or the ozone gas binds to phosphorus in the phosphate framework that is uncombined with oxygen.

The step S1 is performed at least once before, for example, the step S3. This allows lithium to be introduced in such a state that the phosphate framework is present, thereby enabling the diffusion of lithium in the substrate to be prevented. The step S1 may be performed at least once before, for example, the step S2 and/or may be performed at least once before, for example, the step S4.

The order of the steps S1 to S4 is not limited to those described above. For example, the step S3 may be performed after the step S2. The step S3 may be performed after the step S4. The step S3 may be performed before the step S1. When the method for producing the LiPON film includes, for example, such a repetitive treatment as shown in FIG. 2B, the phosphate framework is formed in the first cycle and therefore the order of the steps S1 to S4 in the second and subsequent cycles may be arbitrarily set.

The phosphate framework is formed by performing the step S1 at least once before the step S2. The phosphate framework is formed in such a manner that, for example, the steps S1, S11, S2, and S12 are performed in that order as shown in FIG. 2B.

The relative proportion of each element in the LiPON film may be controlled depending on, for example, the flow rate of the first precursor, the duration of a pulse of the first precursor, the flow rate of the second precursor, the duration of a pulse of the second precursor, and the duration of a pulse of the purge gas. The relative proportion of each element in the oxynitride film may be controlled in such a manner that, for example, (i) the flow rate of the second precursor, which has the lowest vapor pressure and contains lithium, is set and (ii) the flow rate of another element gas and the duration of a pulse of the element gas are set using the flow rate of the set second precursor as a base.

The amount of lithium is set such that the amount of lithium is sufficient to grow a film and is not too much and nitrogen can be introduced into the film. Nitrogen binds to phosphorus in $Li_3PO_4$ and is thereby introduced into the film.

The temperature in the reactor 2 is set to, for example, 400° C. to lower than 480° C.

Since the vapor pressure of the first precursor, which contains phosphorus, is relatively high, the temperature of the first precursor feeder 3 may be, for example, about 1° C. to 50° C. or about 5° C. to 45° C. Since the vapor pressure of the second precursor, which contains lithium, is relatively low, the temperature of the second precursor feeder 4 may be, for example, 100° C. to 180° C. The temperature of the purge gas may be, for example, 150° C. to 250° C. The temperature of the oxygen gas and/or the ozone gas may be, for example, 150° C. to 250° C. The temperature of the ammonia gas and/or the nitrogen gas may be, for example, 150° C. to 250° C. These temperature conditions allow the unevenness of the thickness of the LiPON film to be reduced. The flow rate of each gas, the duration of a pulse of the gas, and the purge time may be appropriately selected from the above-mentioned conditions.

3. OXYNITRIDE FILM

An example of the structure of an oxynitride film according to an embodiment is described below. The oxynitride film may be one produced by, for example, the above-mentioned method.

3-1. Structure of Oxynitride Film

The oxynitride film contains a network former and at least one of an alkali metal element and an alkaline-earth metal element.

An X-ray photoelectron spectroscopy spectrum (XPS spectrum) of the oxynitride film contains a first peak component originating from triply coordinated nitrogen (—N<) and a second peak component originating from doubly coordinated nitrogen (—N=). The ratio of the intensity of the first peak component to the intensity of the second peak component may be 50% or less, 40% or less, or 30% or less. Herein, the term "triply coordinated nitrogen" refers to a nitrogen atom singly bonded to three atoms and the term "doubly coordinated nitrogen" refers to a nitrogen atom singly bonded to a single atom and doubly bonded to another single atom. A nitrogen atom binds to, for example, atoms making up the network formers. The first peak component need not appear perceptibly in the measured XPS spectrum and may be found by fitting the XPS measured spectrum and a fitting curve as described below.

When the atom making up the network former includes phosphorus, a peak component originating from triply coordinated nitrogen is one appearing at about 399.4 eV and a peak component originating from doubly coordinated nitrogen is one appearing at about 397.9 eV.

3-2. Composition of LiPON Film

An example of the lithium phosphorus oxynitride (Li-PON) film is defined by an elemental concentration profile which exhibits the following characteristics.

The element concentration profile in the depth direction of the LiPON film exhibits that, in each position over a lower surface from an upper surface thereof, a concentration of phosphorus may be within a range of 5 to 30 atomic percent, 8 to 25 atomic percent, or 10 to 20 atomic percent with respect to all elements making up the LiPON film.

The element concentration profile in the depth direction of the LiPON film exhibits that, in each position over a lower surface from an upper surface thereof, a concentration of nitrogen may be within a range of 0.2 to 15 atomic percent, 0.5 to 12 atomic percent, or 1.0 to 10 atomic percent with respect to all the elements making up the LiPON film.

The element concentration profile in the depth direction of the LiPON film exhibits that, in each position over a lower surface from an upper surface thereof, a concentration of oxygen may be within a range of 40 to 70 atomic percent, 45 to 65 atomic percent, or 50 to 60 atomic percent with respect to all the elements making up the LiPON film.

The element concentration profile in the depth direction of the LiPON film exhibits that, in each position over a lower surface from an upper surface thereof, a concentration of lithium may be within a range of 10 to 40 atomic percent, 15 to 35 atomic percent, or 17 to 30 atomic percent with respect to all the elements making up the LiPON film.

The composition of the LiPON film may be even in, for example, the depth direction thereof.

In the present disclosure, the expression "an element concentration profile (in the depth direction) of the LiPON film exhibits that, in each position over a lower surface from an upper surface thereof, a concentration of Element A is within a range of x to y atomic percent with respect to all elements making up the LiPON film" means that in an element concentration profile in which the vertical axis represents the concentration and the horizontal axis represents the depth of the LiPON film, the concentration of Element A is within a range of x to y atomic percent in each depthwise position, excluding a region in the vicinity of the upper surface of the LiPON film and a region in the vicinity of the lower surface thereof. Herein, the upper and lower surfaces of the LiPON film are determined from the element concentration profile. The vicinity of the upper surface is, for example, a region within 1 nm from the upper surface. The vicinity of the lower surface is, for example, a region within 1 nm from the lower surface. The depth direction is the direction from the upper surface of the LiPON film toward the lower surface thereof. Methods and conditions for composition analysis are as described in examples below.

4. EXAMPLES

The method according to any one of the above embodiments and oxynitride films produced by the method in various examples are described below.

4-1. Example 1

In Example 1, a LiPON film was produced using the production apparatus 1 shown in FIG. 1. In Example 1, the following method was used: substantially the same method as the flow shown in FIG. 2C except the step S4.

Each of the first precursor feeder 3 and the second precursor feeder 4 was a precursor bottle (Japan Advanced Chemicals Ltd). The reactor 2, a sample holder placed in the reactor 2, the first precursor feeder 3, the second precursor feeder 4, and various pipes used were made of stainless steel (SUS316). Ribbon heaters were wound around the reactor 2, the first precursor feeder 3, the second precursor feeder 4, and the pipes. These parts were heated by heating the ribbon heaters. The temperature of each of these parts was measured with a thermocouple and was controlled by a temperature controller. The mass flow controllers 5a to 5e and the valves V1 to V7 were controlled using a sequencer, MELSEC-Q (Mitsubishi Electric Corporation) and a control program (Nihon Spread K.K). The mass flow controllers 5c and 5e were SEC-E40 (Horiba Stec, Co., Ltd). The mass flow controller 5d was SEC-N112MGM (HORIBA STEC, Co., Ltd). The needle valve NV was a bellows seal valve, SS-4BMG (Swageloc Co). The degree of vacuum in the reactor 2 was measured with a Pirani gauge, TPR280 DN16 ISO-KF (Pfeiffer Vacuum). The degree of vacuum in the reactor 2 was controlled at $10^{-1}$ Pa to $10^{-3}$ Pa during film formation by adjusting the opening of the manual valve MV3.

A substrate used was a glass substrate provided with Au electrodes. The Au electrodes were comb-shaped electrodes with a pitch of 5 µm. The glass substrate provided with the Au electrodes was placed in the reactor 2. A first precursor used was tris(dimethylamino)phosphine (TDMAP). A second precursor used was lithium tert-butoxide (Li (t-OBu)). A purge gas used was an argon gas. The oxygen feeder 12 was capable of supplying an oxygen gas. The nitrogen feeder 13 was capable of supplying an ammonia gas.

The temperature in the reactor 2 was set to 450° C. The temperature of the first precursor feeder 3 was set to 40° C. The temperature of the second precursor feeder 4 was set to 100° C. The temperature of each of the first and second pipes P1 and P2 was set to 170° C. The temperature of each of all pipes other than the first and second pipes P1 and P2 was set to 200° C. The flow rate of each of the oxygen gas, the ammonia gas, and the purge gas was set to 50 ml/min. The manual valves MV1 and MV2 were consistently open. The flow rate of an auxiliary gas supplied from each of the auxiliary gas feeder 7 and the auxiliary gas feeder 9 was set to 50 ml/min. The opening of the needle valve NV was 50%.

Before the step S1 shown in FIG. 2C was performed, a preparation step below was performed. The valve V7 was opened, the purge gas was supplied into the reactor 2 from the purge gas feeder 14 for about 1,800 seconds, and the valve V7 was then closed. Next, the valve V5 was opened, the oxygen gas was supplied into the reactor 2 from the oxygen feeder 12 for 2 seconds, and the valve V5 was then closed. Thereafter, a purge step was performed for 8 seconds.

Figure 2C:
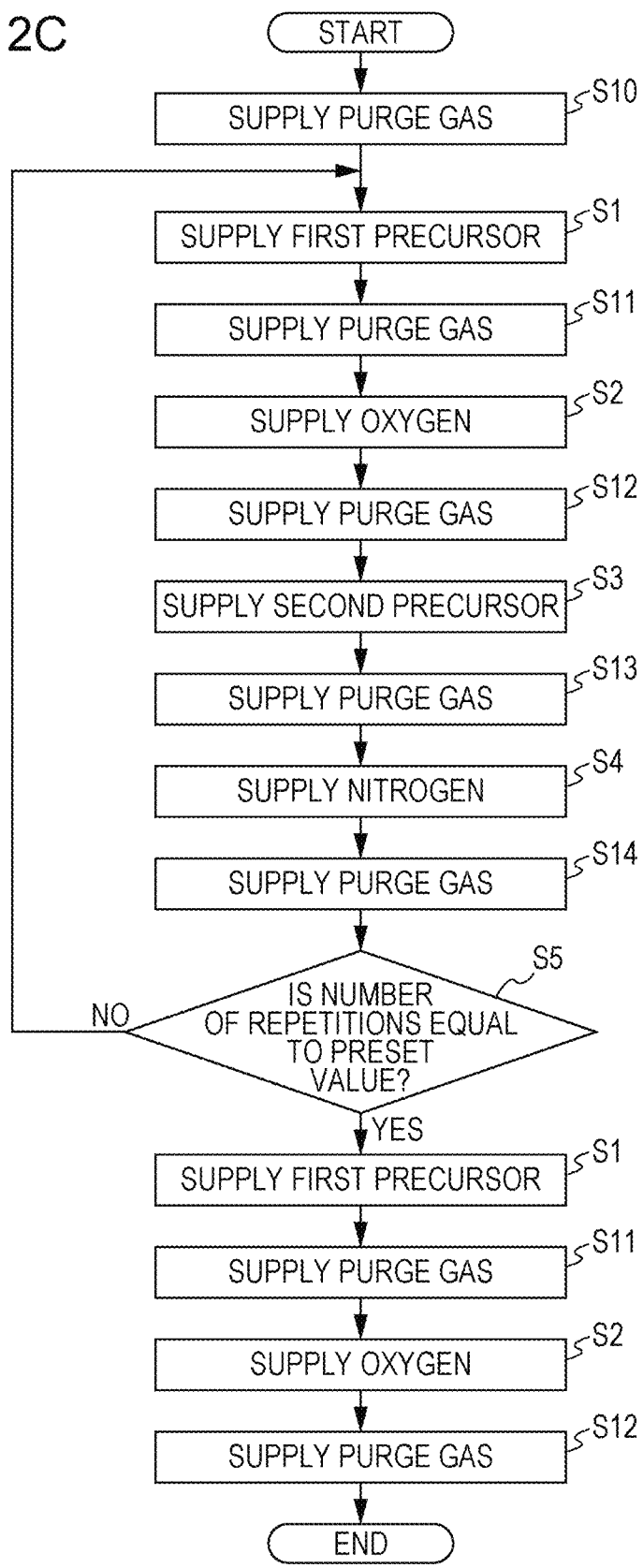
FIG. 2C is a flowchart showing an example of a method for producing an oxynitride film according to an embodiment.

After the preparation step was performed, a repetitive cycle shown in FIG. 2C was performed 7,246 times. Incidentally, the method used in this example was different from the flowchart shown in FIG. 2C in that the step S4 was continuously performed from the start to end of film formation. In particular, the valve V6 was opened simultaneously with the start of the first cycle and was closed simultaneously with the end of the 7,246th cycle. The flow rate of the ammonia gas was 100 ml/min. The temperature of the ammonia gas was 200° C.

In the step S1, the duration of a pulse of TDMAP was 0.5 seconds. In the step S2, the duration of a pulse of the oxygen gas was 2 seconds. In the step S3, the duration of a pulse of Li (t-OBu) was 1 second. In the steps S11 to S14, the duration of a pulse of the argon gas was 8 seconds, that is, the purge time was 8 seconds. An interval of 1 second was interposed between the steps S13 and S14.

The obtained LiPON film was observed with a scanning electron microscope (SEM). The LiPON film had a thickness of 524.5 nm.

Figure 4:
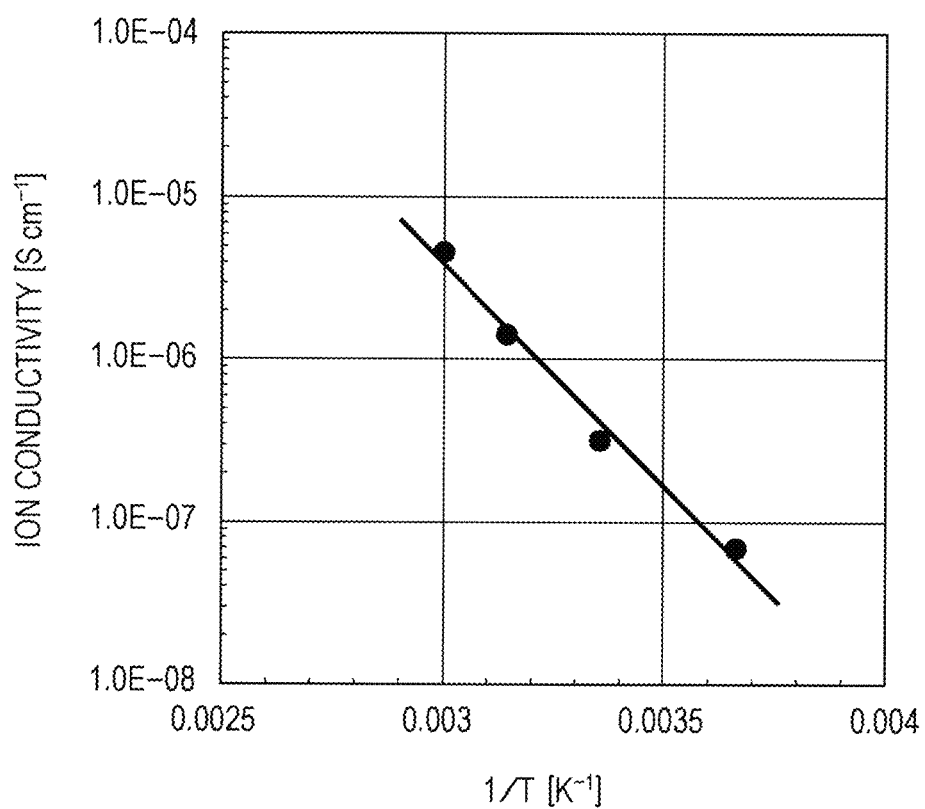
FIG. 4 is a graph showing an Arrhenius plot for the LiPON film produced in Example 1.

Impedance characteristics of the LiPON film were measured using an impedance meter, Modulab (Solartron). FIG. 3 shows an impedance spectrum of the LiPON film. The ionic conductivity of the LiPON film was $3.2 \times 10^{-7}$ Scm$^{-1}$ as determined from the impedance spectrum. FIG. 4 shows an Arrhenius plot for the LiPON film. The activation energy calculated from the Arrhenius plot was 0.54 eV. These results confirmed that the LiPON film has a function as a solid electrolyte.

4-2. Example 2

A LiPON film was produced in Example 2 under substantially the same conditions as those used in Example 1 except that the number of repetitive cycles was 250.

The obtained LiPON film had the composition $Li_{2.35}PO_{3.58}N_{0.28}$.

Figure 5:
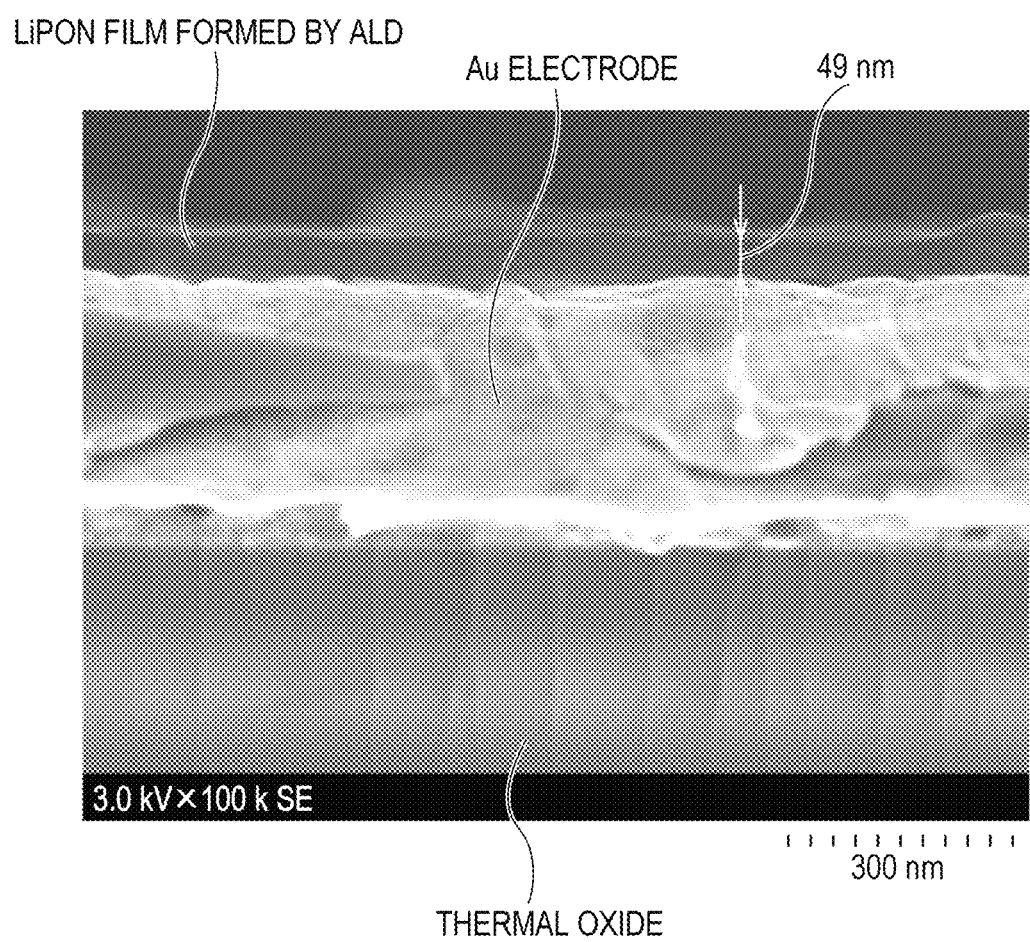
FIG. 5 is an illustration showing a cross-sectional STEM image of a LiPON film produced in Example 2.

The LiPON film was observed with a scanning transmission electron microscope (STEM), FB2100 (Hitachi High-Technologies Corporation). The LiPON film had a thickness of 49 nm. FIG. 5 shows a cross-sectional STEM image of the LiPON film.

4-3. Example 3

A lithium cobaltate (LiCoO$_2$) layer was provided on a substrate. A LiPON film was produced on the LiCoO$_2$ layer by substantially the same method as that used in Example 1. Furthermore, an osmium film was formed on the LiPON film by a sputtering process using a sputtering system, HPC-1SW (Vacuum Device Inc). The obtained LiPON film was observed with a STEM. The LiPON film had a thickness of about 340 nm.

4-4. Examples 4 to 8

A LiPON film was produced in Example 4 under substantially the same conditions as those used in Example 1 except that the duration of a pulse of the second precursor was 2 seconds and the number of repetitive cycles was 250.

A LiPON film was produced in Example 5 under substantially the same conditions as those used in Example 1 except that the duration of a pulse of the second precursor was 2.5 seconds and the number of repetitive cycles was 250.

A LiPON film was produced in Example 6 under substantially the same conditions as those used in Example 1 except that the step S4 was performed with the timing shown in FIG. 2C, the duration of a pulse of the second precursor was 3 seconds, and the number of repetitive cycles was 900.

A LiPON film was produced in Example 7 under substantially the same conditions as those used in Example 1 except that the step S4 was performed with the timing shown in FIG. 2C, the duration of a pulse of the second precursor was 1.5 seconds, and the number of repetitive cycles was 300.

A LiPON film was produced in Example 8 under substantially the same conditions as those used in Example 1 except that the step S4 was performed with the timing shown in FIG. 2C, the duration of a pulse of the second precursor was 3 seconds, and the number of repetitive cycles was 300.

4-5. Composition Analysis of LiPON Films

The composition of each of the LiPON films produced in Examples 1 and 4 to 8 was analyzed in the depth direction thereof by X-ray photoelectron spectroscopy (XPS). In particular, the XPS measurement of each LiPON film and the sputtering of the LiPON film with Ar were alternately repeated, whereby the element concentration profile in the depth direction of the LiPON film was measured.

Figure 6:
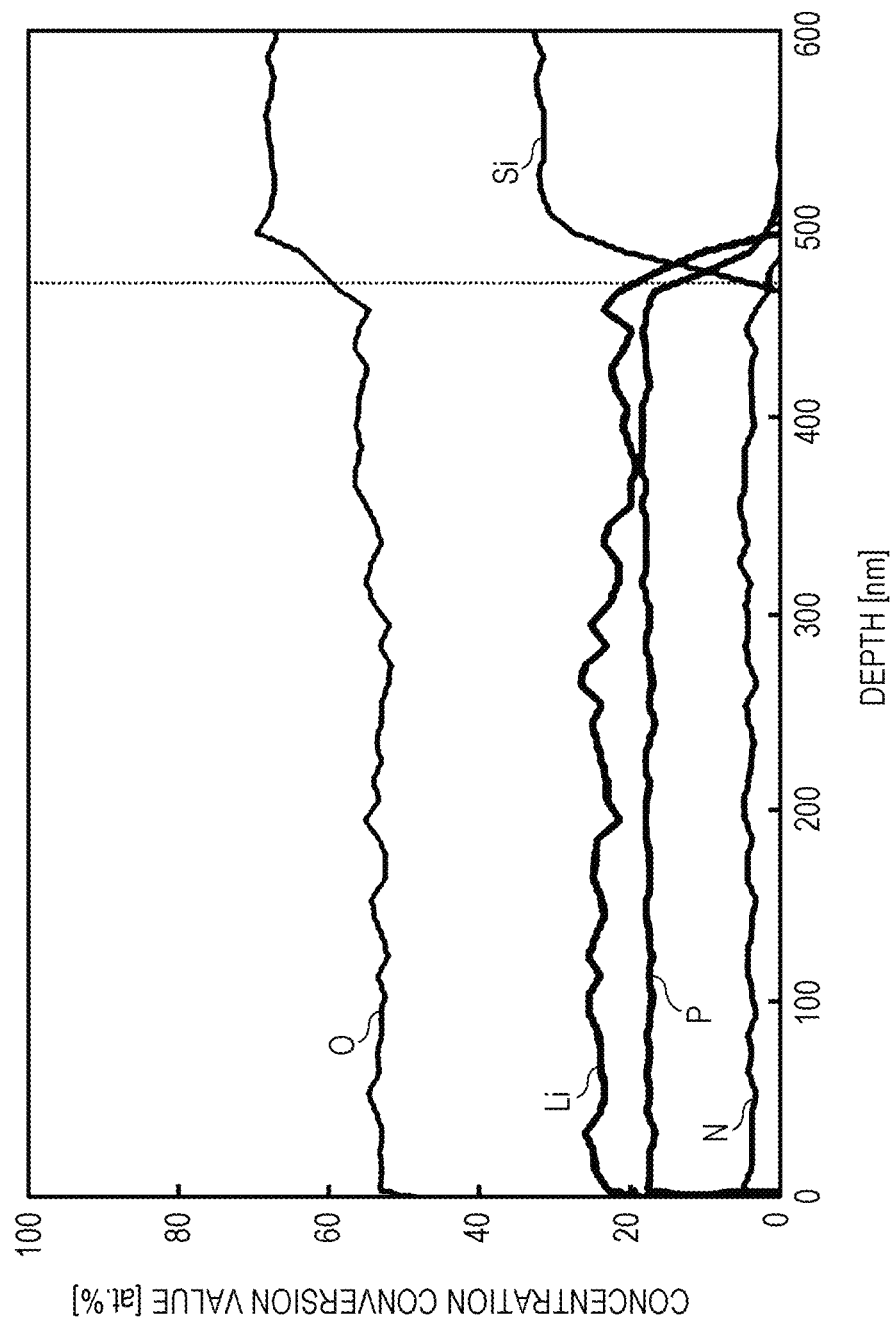
FIG. 6 is a graph showing the element concentration profile in the depth direction of a LiPON film produced in Example 3.

FIG. 6 shows the element concentration profile in the depth direction of the LiPON film produced in Example 1. In FIG. 6, the vertical axis represents the concentration (atomic percent) of each element and the horizontal axis represents the depth (nm). In FIG. 6, a region on the left side of a dotted line indicates the concentration profile of each element in the LiPON film and a region on the right side of the dotted line indicates the concentration profile of each element in the glass substrate.

As shown in FIG. 6, the concentration profile of each of Li, P, O, and N in the LiPON film produced in Example 1 was substantially constant in the depth direction.

The Table shows the thickness of the LiPON film produced in each of Examples 4 to 8 and the average abundance ratio of nitrogen in the LiPON film. The average abundance ratio of nitrogen was calculated in such a manner that the abundance ratio of nitrogen was determined in arbitrary three to eight spots, different in depth from each other, in the LiPON film and obtained measurements were averaged. Herein, the abundance ratio of nitrogen is the proportion of the concentration (atomic percent) of nitrogen on the basis of the concentration (atomic percent) of phosphorus determined by XPS measurement.

As is clear from the Table, the LiPON films produced in Examples 4 and 5 have a high nitrogen abundance because of the continuous supply of the ammonia gas.

TABLE

| | Thickness (nm) | Average abundance ratio of nitrogen |
|---|---|---|
| Example 4 | 30 | 0.47 |
| Example 5 | 40 | 0.37 |

TABLE-continued

| | Thickness (nm) | Average abundance ratio of nitrogen |
|---|---|---|
| Example 6 | 100 | 0.10 |
| Example 7 | 10 | 0.21 |
| Example 8 | 30 | 0.11 |

4-6. Example 9

A LiPON film was produced under substantially the same conditions as those used in Example 1 except that the step S4 was performed with the timing shown in FIG. 2C, a substrate used was a quartz glass substrate, and the number of repetitive cycles was 999.

Figure 8A:
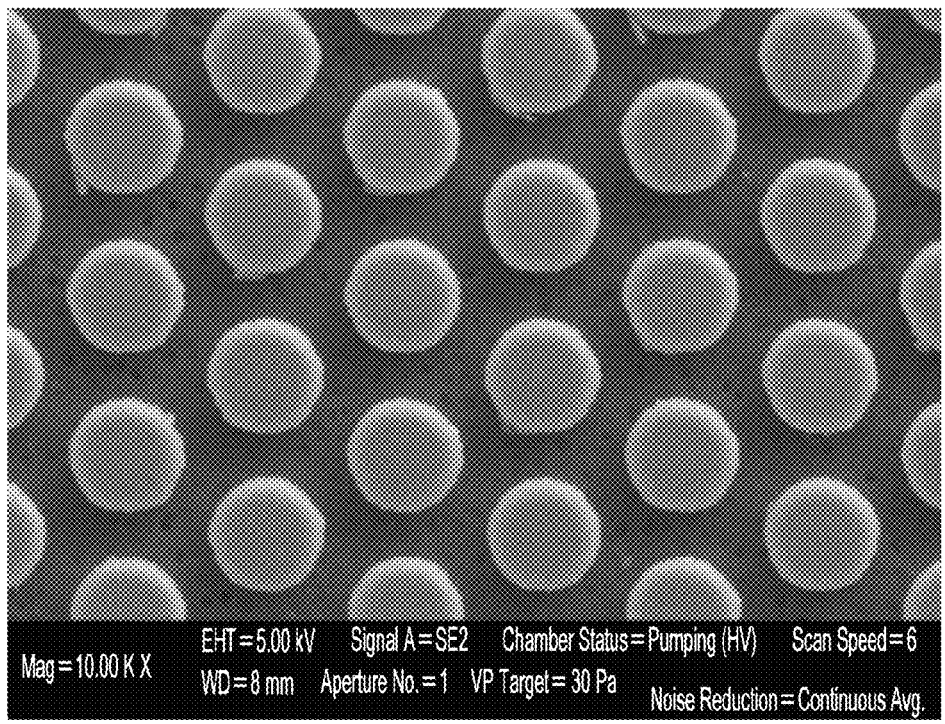
FIG. 8A is an illustration showing a SEM image of the upper surface of a quartz glass substrate free from a LiPON film produced in Example 9.
Figure 8B:
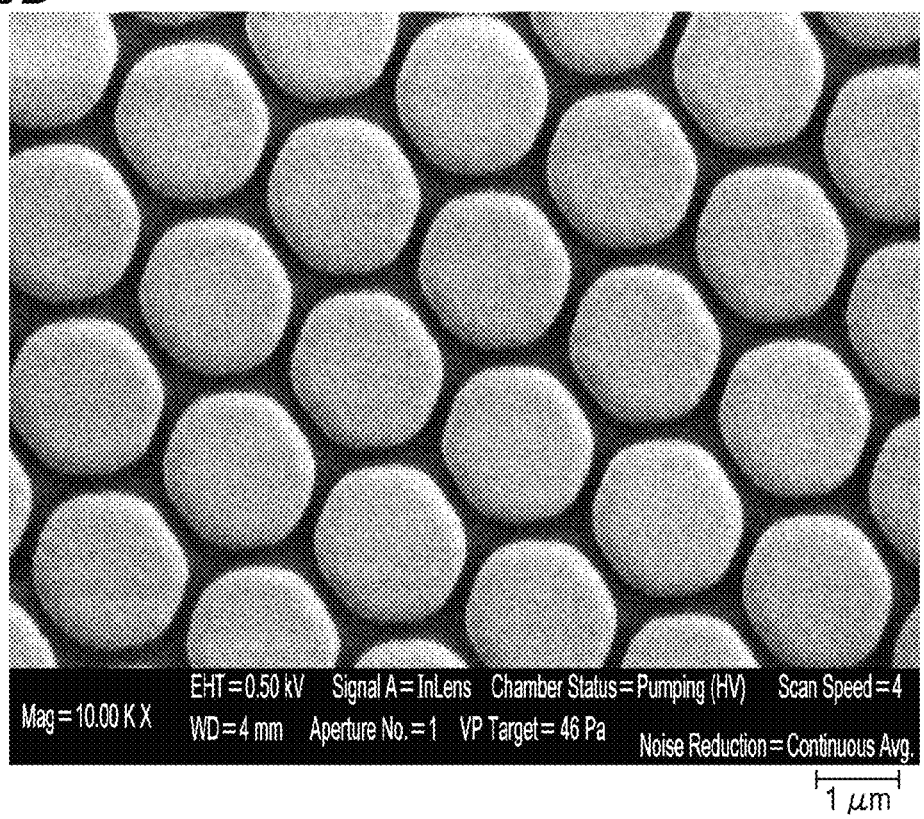
FIG. 8B is an illustration showing a SEM image of the upper surface of the LiPON film produced in Example 9.

FIG. 8A shows results obtained by observing the upper surface of the quartz glass substrate with a SEM, S-5500 (Hitachi High-Technologies Corporation). FIG. 8B shows results obtained by observing the LiPON film formed on the upper surface of the quartz glass substrate with the SEM equipped with an in-lens detector.

Figure 9A:
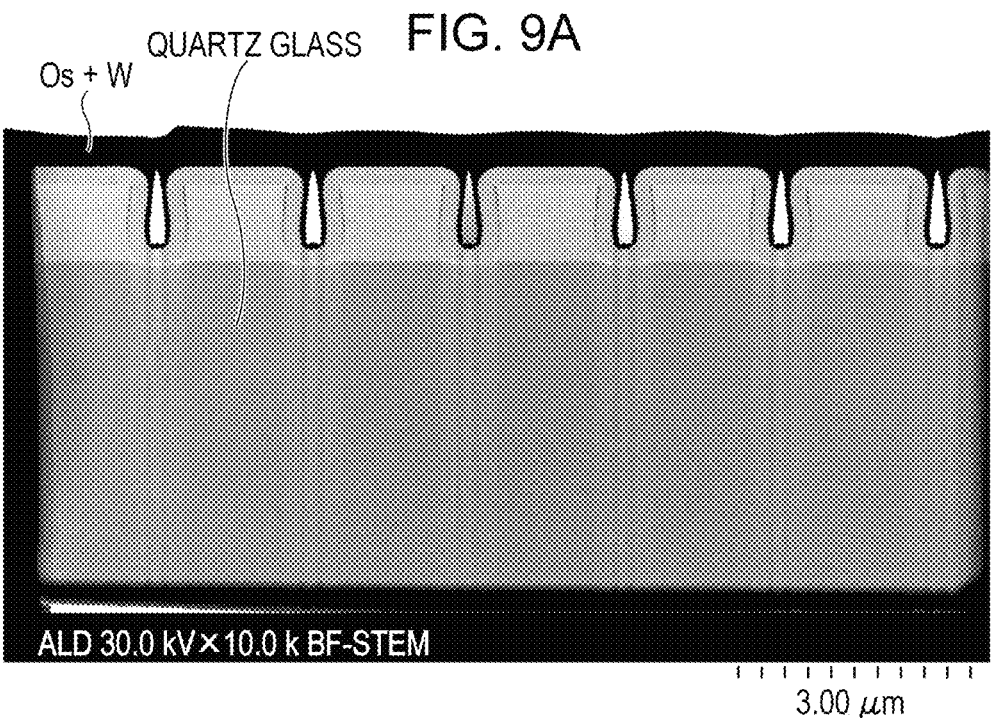
FIG. 9A is an illustration showing a cross-sectional STEM image of the LiPON film produced in Example 9.
Figure 9B:
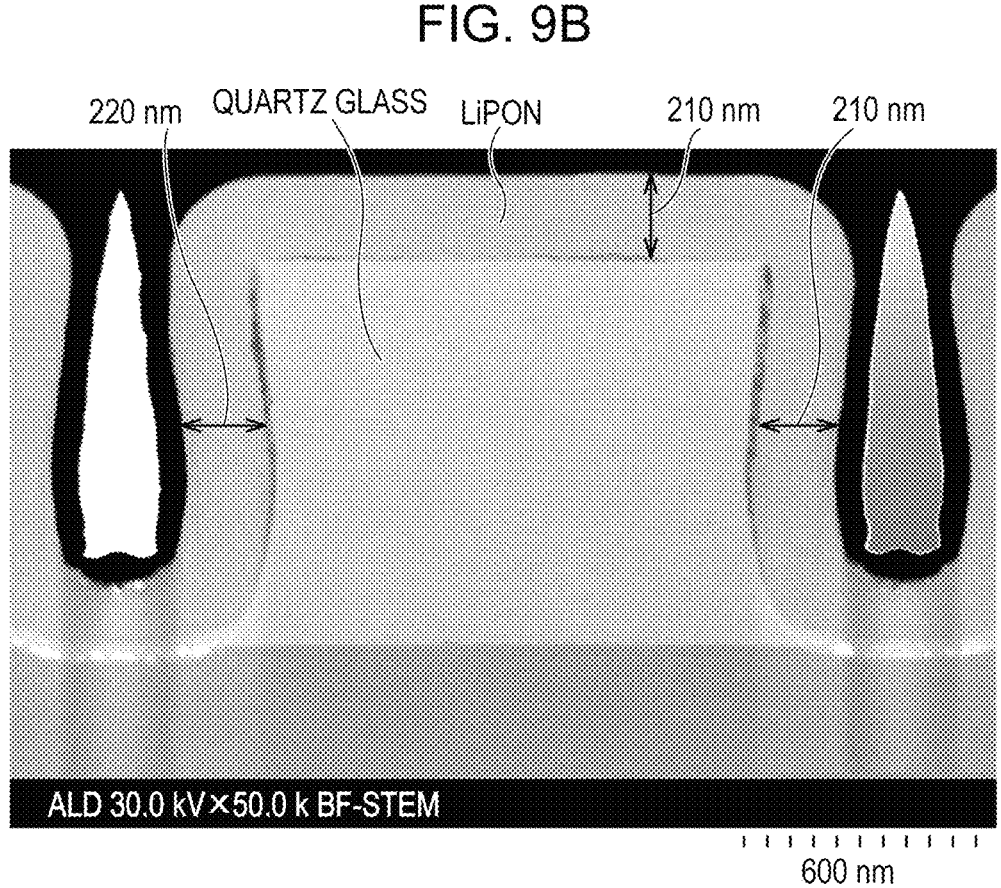
FIG. 9B is an illustration showing an enlarged cross-sectional STEM image of the LiPON film produced in Example 9.

Furthermore, an osmium film serving as a protective film was formed on the LiPON film in the same manner as that used in Example 3. Next, the osmium film was coated with tungsten, whereby a stack was obtained. The obtained stack was cut with a focused ion beam processing system, FB-2100 (Hitachi High-Technologies Corporation). A cross section of the stack was observed with a STEM. FIGS. 9A and 9B show images observed with the STEM. FIG. 9B is an enlarged view of the image shown in FIG. 9A. From FIG. 9B, the thickness of the LiPON film was determined to be 210 nm to 220 nm.

4-7. XPS Spectrum of LiPON Film

Figure 10:
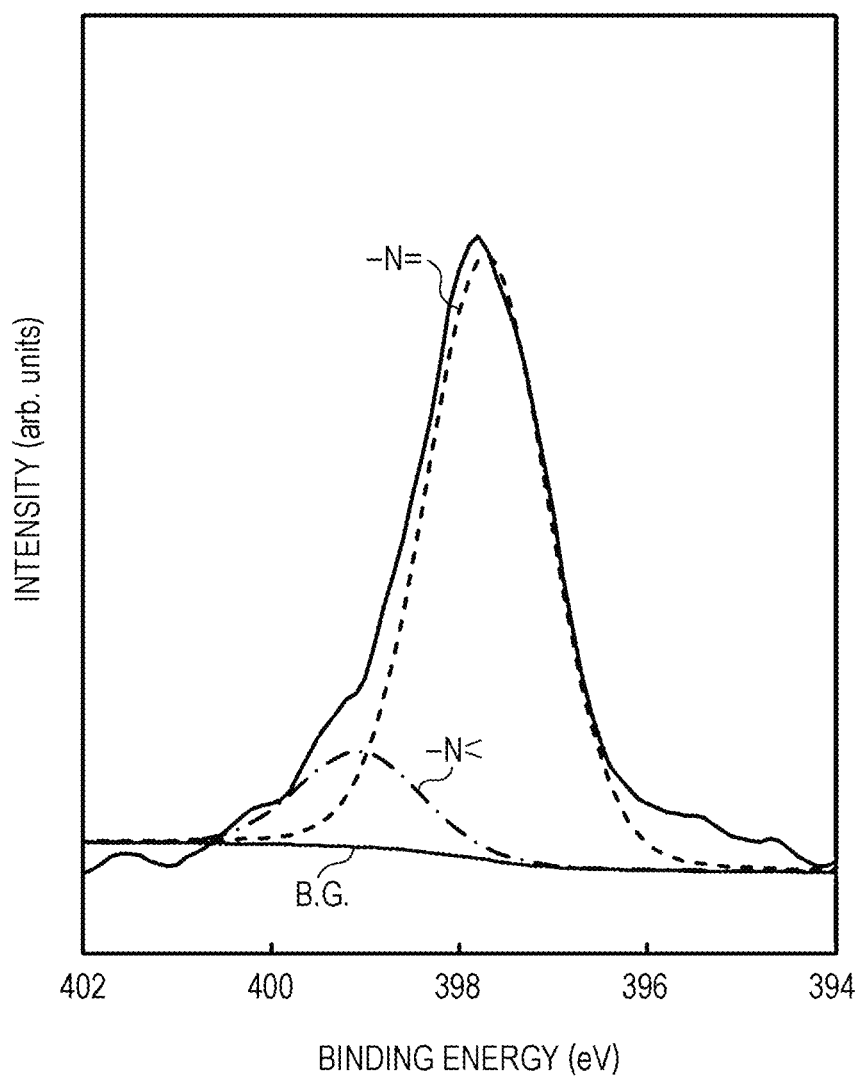
FIG. 10 is a graph showing an XPS spectrum of the LiPON film produced in Example 2.

FIG. 10 shows an XPS spectrum of the LiPON film produced in Example 2. In FIG. 10, a continuous line represents a spectrum obtained by XPS measurement, a dashed dotted line represents a fitting curve originating from triply coordinated nitrogen, a dashed line represents a fitting curve originating from doubly coordinated nitrogen, and a line indicated by "B. G." represents a background curve.

An XPS system, PHI 5000 Versa probe (Ulvac-Phi, Inc.) was used to measure the XPS spectrum. Peak analysis software, Multipack (Ulvac-Phi, Inc.) was used for Gaussian fitting. Waveform separation and baseline setting were performed with a "Fit" menu in the peak analysis software. Triply coordinated nitrogen and doubly coordinated nitrogen were determined from the area ratio of a peak component showing triply coordinated nitrogen and a peak component showing doubly coordinated nitrogen. The background curve for the XPS spectrum was determined by the Shirley method.

4-8. Comparison Between ALD Process and Sputtering Process

A LiPON film was produced in a comparative example by a sputtering process. In the comparative example, a planar magnetron sputtering system was used to produce the LiPON film.

Figure 7A:
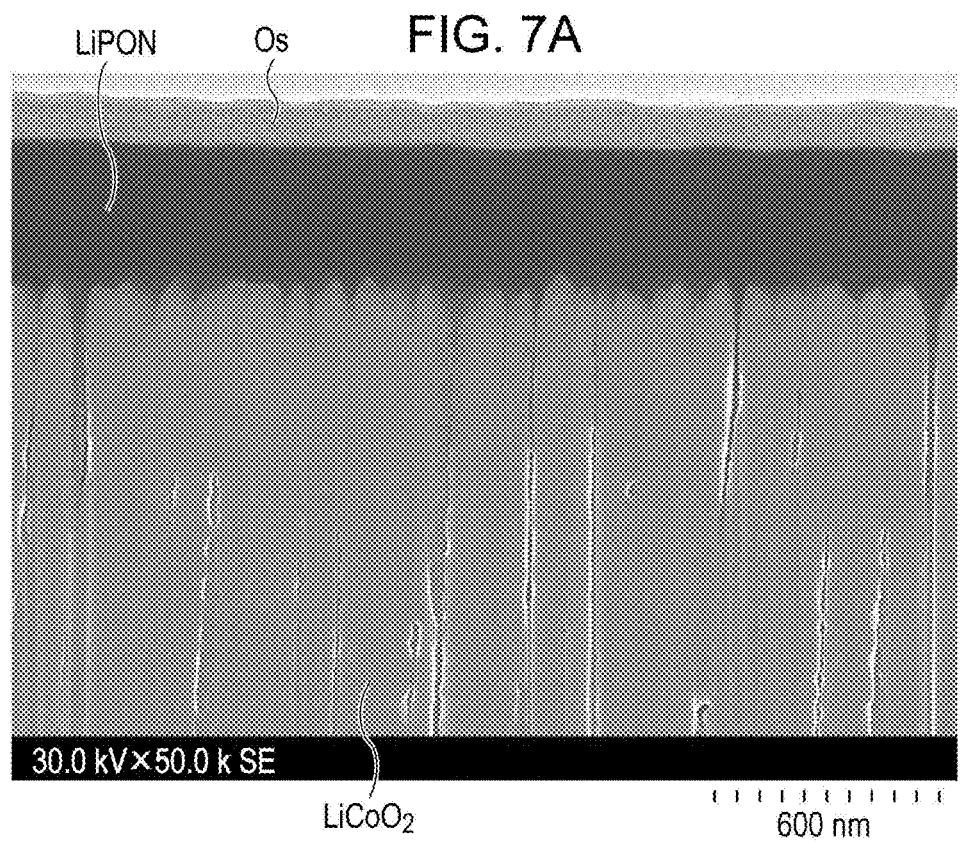
FIG. 7A is an illustration showing a cross-sectional SEM image of the LiPON film produced in Example 3.
Figure 7B:
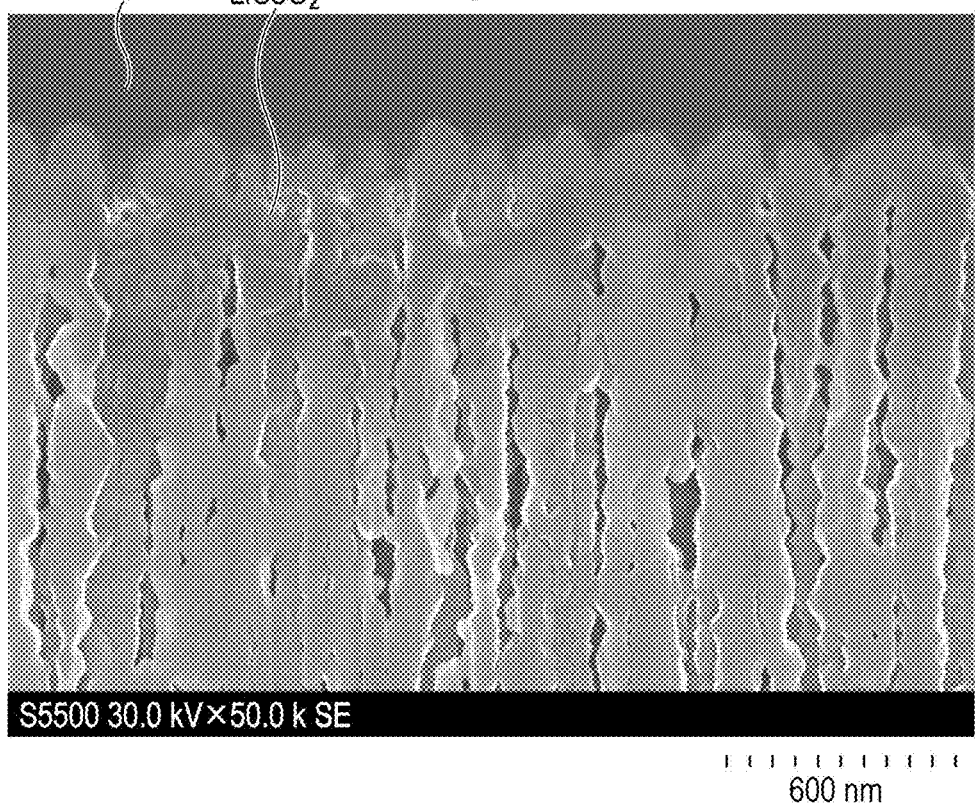
FIG. 7B is an illustration showing a cross-sectional SEM image of a LiPON film produced in a comparative example.

FIG. 7A is a cross-sectional SEM image of the LiPON film produced in Example 3. FIG. 7B is a cross-sectional SEM image of the LiPON film produced in the comparative example. As shown in FIG. 7A, the LiPON film produced in Example 3 is placed along an interface with a lithium cobaltate layer and extends between crystals in the lithium cobaltate layer. This shows that an oxynitride film produced by a method according to an embodiment has high conformality. However, as shown in FIG. 7B, the LiPON film produced in the comparative example has cavities in many locations and is inferior in conformality.

Figure 11:
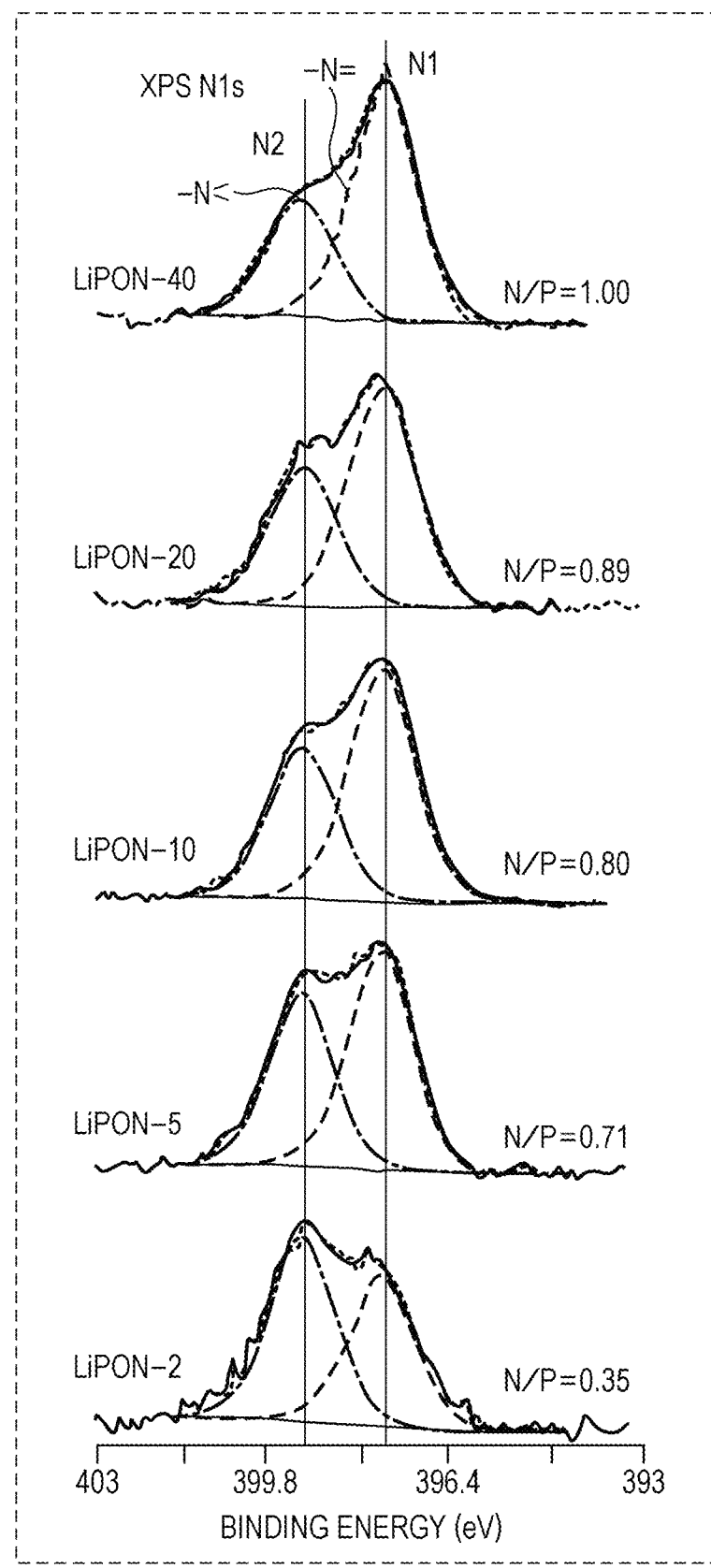
FIG. 11 is a graph showing an XPS spectrum of a LiPON film formed by a sputtering process.

FIG. 11 shows an XPS spectrum of a LiPON film produced by a sputtering process disclosed in B. Fleutot et al, Solid State Ionics, 186 (2011), pp 29-36. In FIG. 11, the intensity of a peak component originating from triply coordinated nitrogen (—N<) is 50% or more of the intensity of a peak component originating from doubly coordinated nitrogen (—N=).

The present disclosure is useful in producing a quaternary oxynitride film. This enables an oxynitride film with excellent conformality to be obtained. The oxynitride film is useful as, for example, a solid electrolyte. The oxynitride film is useful for, for example, all-solid-state lithium batteries and post lithium ion secondary batteries. Furthermore, the oxynitride film can be used as, for example, a protective film protecting the surface of an active material in a non-aqueous lithium ion secondary battery and also can be used as a gate-insulating film for electric double layer transistors.

What is claimed is:

1. A method for producing an oxynitride film, comprising:
(A) supplying a first precursor containing a network former into a reactor in which a substrate is placed;
(B) supplying at least one selected from the group consisting of an oxygen gas and an ozone gas into the reactor;
(C) supplying a second precursor containing at least one selected from the group consisting of an alkali metal element and an alkaline-earth metal element into the reactor;
(D) supplying an ammonia gas into the reactor; and
(E) supplying a purge gas into the reactor,
wherein a process cycle including (A), (B), (C), and (E) is repeated a plurality of times while (D) is continuously performed.

2. The method according to claim 1, wherein, in one process cycle, (E) is performed each time after (A), (B), or (C) is performed once.

3. The method according to claim 1, wherein, in one process cycle, (A) is performed before (B).

4. The method according to claim 1, wherein, in one process cycle, (A) and (C) are performed in different periods.

5. The method according to claim 1, wherein the second precursor contains at least one selected from the group consisting of Li, Na, Mg, and Ca.

6. The method according to claim 1, wherein the network former contains at least one selected from the group consisting of P, B, Si, and V.

7. The method according to claim 1, wherein the oxynitride film contains the network former and at least one selected from the group consisting of the alkali metal element and the alkaline-earth metal element.

8. The method according to claim 1, wherein
the second precursor contains Li, the network former contains P, and
the oxynitride film contains Li, P, O, and N.

9. The method according to claim 1, wherein the oxynitride film has a thickness of 200 nm or less.

10. The method according to claim 1, wherein, in one process cycle, (A), (B), and (C) are separately performed.

11. The method according to claim 1, wherein (E) is continuously performed over the process cycle.

\* \* \* \* \*